(12) United States Patent
Matsubara

(10) Patent No.: US 6,271,594 B1
(45) Date of Patent: Aug. 7, 2001

(54) SEMICONDUCTOR DEVICE AND METHOD OF MANUFACTURING THE SAME

(75) Inventor: Yoshihisa Matsubara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/086,531

(22) Filed: May 29, 1998

(30) Foreign Application Priority Data

May 29, 1997 (JP) .................................................. 9-140364

(51) Int. Cl.[7] .................................................. H01L 29/51
(52) U.S. Cl. .................................................. 257/760; 257/77
(58) Field of Search ........................................ 257/77, 760

(56) References Cited

U.S. PATENT DOCUMENTS

| | | | | |
|---|---|---|---|---|
| 5,559,367 | * | 9/1996 | Cohen | 257/77 |
| 5,679,269 | * | 10/1997 | Cohen | 257/77 |
| 5,698,901 | * | 12/1997 | Endo | 257/758 |
| 5,990,493 | * | 11/1999 | Gardner | 257/77 |
| 6,091,081 | * | 7/2000 | Matsubara | 257/77 |

FOREIGN PATENT DOCUMENTS

| | | |
|---|---|---|
| 3-102819 | 4/1991 | (JP) . |
| 3-87047 | 4/1991 | (JP) . |
| 5-114729 | 5/1993 | (JP) . |
| 5-347299 | 12/1993 | (JP) . |
| 8-64591 | 3/1996 | (JP) . |
| 8-83842 | 3/1996 | (JP) . |
| 8-236517 | 9/1996 | (JP) . |
| 8-264648 | 10/1996 | (JP) . |
| 97-13116 | 3/1997 | (KR) . |

OTHER PUBLICATIONS

48th Symposium Lecture, with respect to a Semiconductor Integrated Circuit Technique, pp. 134–139.
Japanese Office Action dated Jun. 22, 1999, with partial translation.

* cited by examiner

Primary Examiner—Jerome Jackson, Jr.
(74) Attorney, Agent, or Firm—McGinn & Gibb, PLLC

(57) ABSTRACT

In a semiconductor device, a pair of diffusion regions are placed in a silicon substrate. Herein, the diffusion regions serve as source and drain regions. Further, a gate oxide film is formed between the diffusion layers or regions and on the silicon substrate. Moreover, a gate electrode is placed on the gate oxide film. In addition, a diamond-like carbon layer is formed over the silicon substrate so as to cover at least the gate oxide film. With such a structure, the diamond-like carbon layer prevents water from diffusing into the gate oxide film.

19 Claims, 8 Drawing Sheets

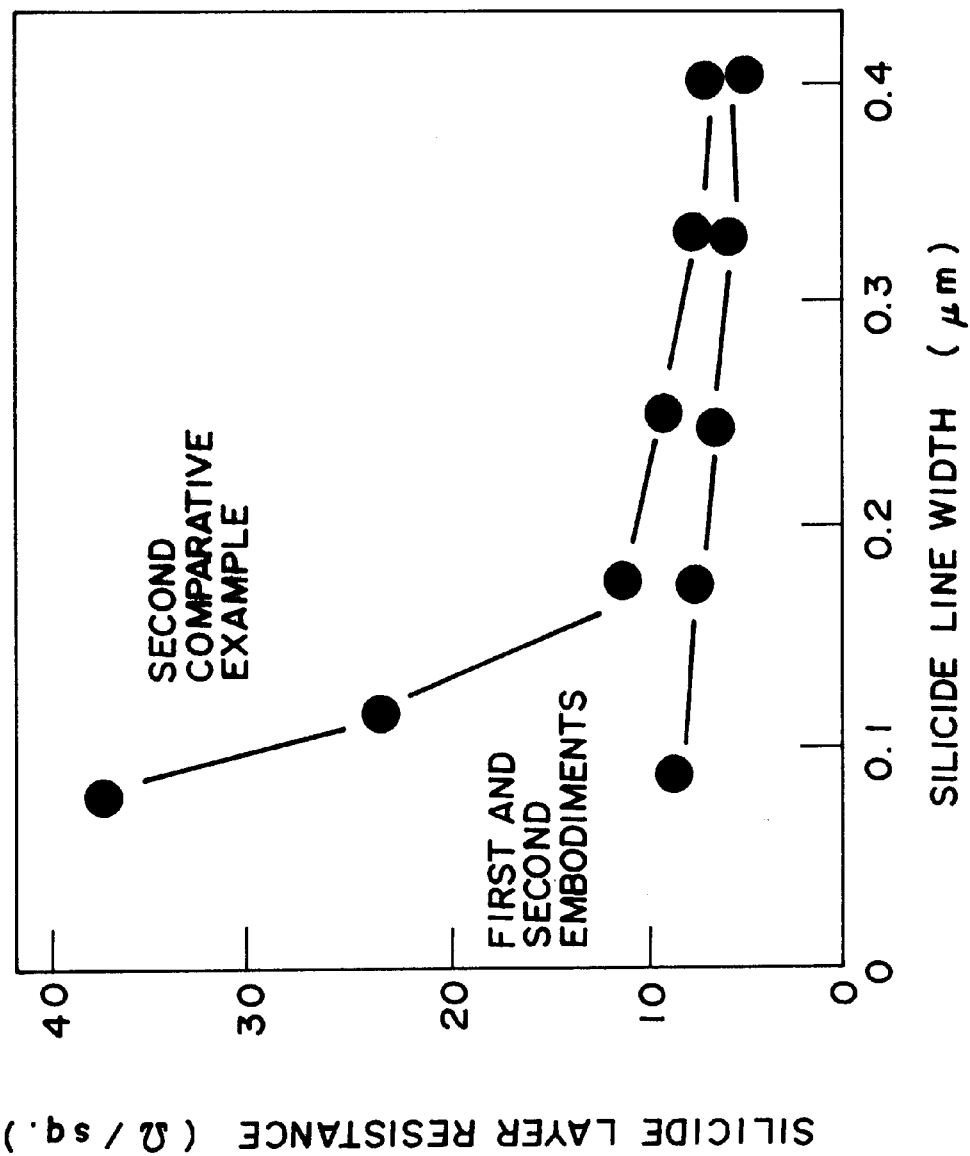

SEMICONDUCTOR DEVICE AND METHOD OF MANUFACTURING THE SAME

BACKGROUND OF THE INVENTION

This invention relates to a semiconductor device and a method of manufacturing the same, and in particular, to a method of forming an interlayer insulating film of a MOSFET.

When a bias voltage is applied to a MOSFET, a threshold voltage, a mutual induction and an on-current are often variable with time. This phenomenon is generally called a hot carrier effect, that reduces the reliability of a device.

Recently, the hot carrier effect often becomes remarkable when a gate length of the device is less than 1 $\mu$m. This hot carrier effect becomes a serious restriction factor to miniaturize the MOSFET. In particular, a gate oxide film is often destroyed by the hot carrier effect. The destruction of the gate oxide film becomes a large problem to miniaturize the transistor, and will be thereinafter referred to as a hot carrier deterioration.

The hot carrier effect is mainly caused by Si—H combinations which become the cause of the hot carrier deterioration. More specifically, water ($H_2O$) diffuses into the gate oxide film to increase the Si—H combinations. This fact has been described in the 48th symposium lecture with respect to a semiconductor integrated circuit technique (water diffusion model for an increase effect of the hot carrier deterioration due to a nitride film passivation, P.134).

To avoid the above problem, a method has been suggested for preventing invasion of the water into a LSI by using the silicon nitride (SiN) film. In this event, the silicon nitride film has an excessively small diffusion factor against the water as a protection film of a parasitic-mold LSI.

A semiconductor device generally has a silicon oxide films for device separation and diffusion layers or regions in a silicon substrate, and will be referred to as a first conventional reference. Further, the gate oxide film is deposited between the diffusion layers and on the silicon substrate. Further, a gate electrode is placed on the gate oxide film. Moreover, spacer oxide films are placed at both side surfaces of the gate electrode.

In this event, metal silicide layers each of which has a high melting point are formed on the surfaces of the diffusion layers and on the gate electrode, respectively. The metal silicide layer often becomes essential to miniaturize the semiconductor device. Further, a silicon oxide film is deposited to cover the silicon oxide films, diffusion layers and the gate electrode, as an interlayer insulating film.

Moreover, metal plugs are formed in the silicon oxide film so as to reach the silicide layers. Further, wiring patterns are formed on the upper surface of the metal plugs. Under this condition, the silicide layers are electrically connected to the wiring patterns via the metal plugs. Finally, the entire surface of the device is covered with the silicon nitride film as a passivation film.

When the silicon nitride film is deposited using the plasma CVD method, the silicon nitride film has a relatively small water-permeability in many cases. However, the problem with respect to the hot carrier deterioration can not be solved in the first conventional reference. Namely, active hydrogen radicals take place when the silicon nitride film is formed in a plasma atmosphere containing ammonia and silane. It has been reported that the hydrogen radicals diffuse the gate oxide film to increase the Si—H combinations which becomes the cause of the deterioration.

On the other hand, when an interlayer insulating film, such as the silicon oxide film, is formed by a SOG (spin on glass) film, the interlayer insulating film normally contains slight water. However, the SiN film does not pass the water through because the silicon nitride film has a relatively small water-permeability, as mentioned before. Consequently, the water in the interlayer insulating film mostly diffuses in the direction of the gate oxide film during a final heat treatment in foaming gas.

Thus, when the water diffuses toward the gate oxide film and the spacer oxide film, an electron trap (namely, water related trap) caused by the water in the oxide film. As a result, the hot carrier-resist is largely reduced. This fact has also been described in the above-mentioned 48th symposium lecture with respect to a semiconductor integrated circuit technique (the water diffusion model for the increasing effect of the hot carrier deterioration due to the nitride film passivation, P.134).

To avoid such a problem, another suggestion has been made about a semiconductor device in which, the silicon nitride film is placed below the silicon oxide film (namely, the interlayer insulating film). Herein, the above semiconductor device will be referred to as a conventional second reference.

With such a structure, when the silicon nitride film is formed by the use of the thermal decomposition CVD method, the diffusion of the water is suppressed because the generation of the active hydrogen radicals is prevented during the formation of the silicon nitride film.

However, the thermal process temperature which is necessary for the thermal decomposition containing the ammonia and the silane is higher than the deposition temperature of the plasma method. Consequently, the heat resistance of the silicide layer becomes a problem. Namely, the short channel effect must be suppressed by preventing the diffusion of the impurities doped in the diffusion layer to achieve high integration.

When the connection surface of the diffusion layer contacts with the silicide layer, a leak current which is caused by crystal defects is increased, and as a result, the switching operation of the transistor becomes impossible. Therefore, the above silicide layer must be thinned in accordance with the shallow connection of the diffusion layer.

However, when the deposition temperature of the silicon nitride film exceeds the heat resistance of the silicide in case of the thin-film silicide which is necessary to miniaturize the transistor, the silicide layer is aggregated to form a discontinues film. As a result, disconnection takes place, and the sheet resistance is largely increased.

SUMMARY OF THE INVENTION

It is therefore an object of this invention to provide a semiconductor device which is highly integrated and which is capable of effectively reducing a hot carrier deterioration while keeping a low resistance even when thin-film silicide layers are placed on the surfaces of diffusion layers and a gate electrode.

It is another object of this invention to provide a semiconductor device which has a high reliability and which is capable of enduring against a stress from an oxide silicon film.

In a semiconductor device according to this invention, a pair of diffusion layers is placed in a silicon substrate. Herein, the diffusion layers serve as source and drain regions. Further, a gate oxide film is formed between the diffusion layers and on the silicon substrate. Moreover, a gate electrode is placed on the gate oxide film. In addition, a diamond-like carbon layer is formed over the silicon substrate so as to cover at least the gate oxide film. With such a structure, the diamond-like carbon layer prevents water from diffusing into the gate oxide film.

According to this invention, a diamond-like carbon layer which does not pass through water is formed so as to contact with diffusion layers and a gate electrode having silicide layers on the surface. Consequently, Si—H combinations are not increasingly formed in the gate oxide film or the spacer film. Further, water can be prevented from diffusing into the gate oxide film or the spacer film from the interlayer insulating film in the subsequent heat process. As a result, hot carrier deterioration can be effectively prevented.

More specifically, hot carrier deterioration can be effectively reduced while keeping a low resistance in the semiconductor device which has the gate oxide film having the film thickness of 10 nm or less and which is used in a fine MOSFET having the gate length of 1 $\mu$m or less. Further, the semiconductor device having high reliability can be obtained, even when the thin-film silicide layers are formed on the diffusion layers and the gate electrode.

Furthermore, the semiconductor device can endure against the stress from the oxide silicon layer to realize the high reliability.

BRIEF DESCRIPTION OF THE DRAWINGS

FIG. 9 is a graph showing a measuring result of a silicide layer resistance.

DESCRIPTION OF THE PREFERRED EMBODIMENTS

Figure 1:
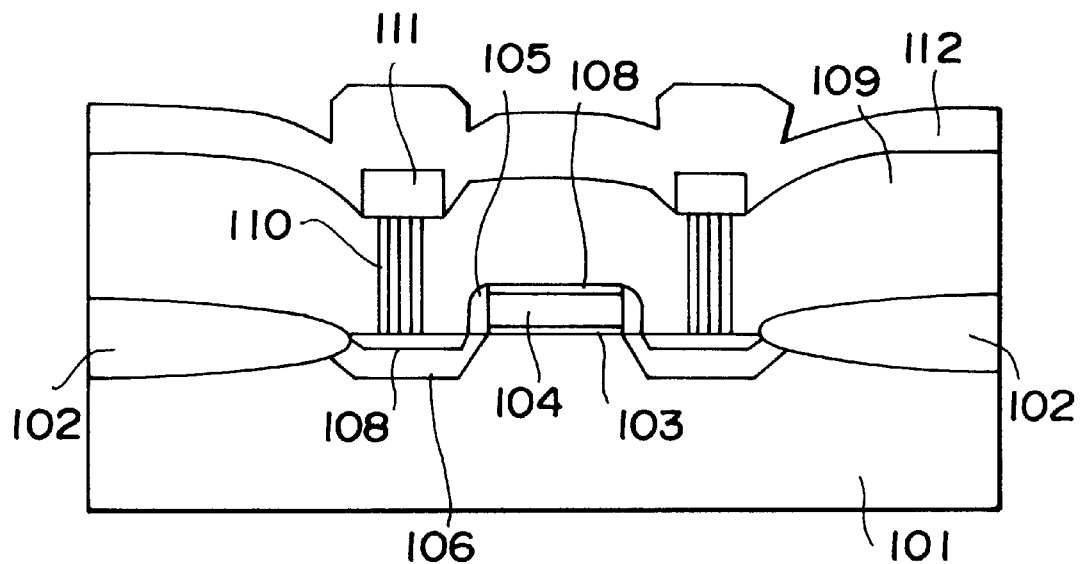
FIG. 1 is a cross sectional view showing a first conventional reference.
Figure 2:
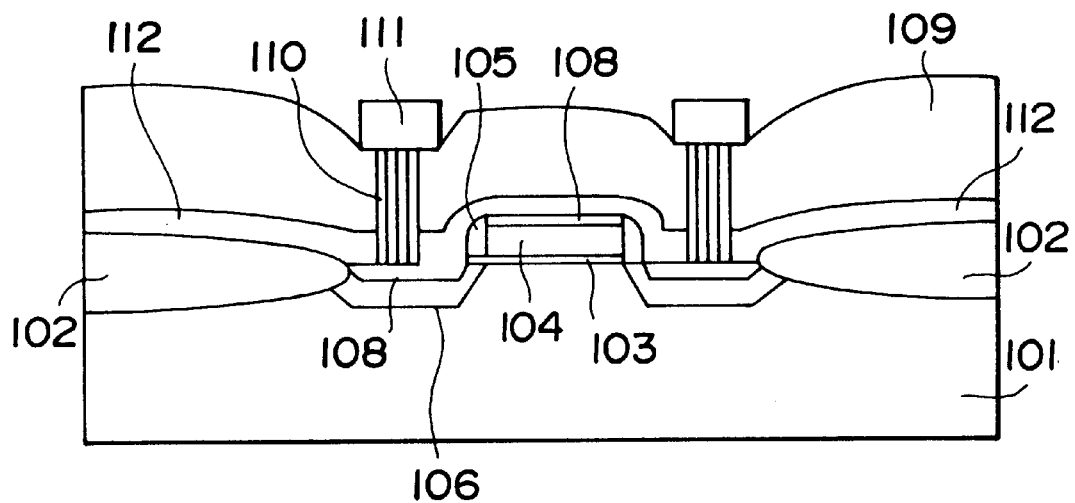
FIG. 2 is a cross sectional view showing a second conventional reference.

Referring to FIGS. 1 and 2, conventional semiconductor devices will be first described for a better understanding of this invention. The semiconductor devices are equivalent to the previously mentioned conventional semiconductor devices.

As illustrated in FIG. 1, silicon oxide films 102 for device separation are formed on a silicon substrate 101 in the first conventional reference. Further, diffusion layers or regions 106 are formed between the silicon oxide films 102 and in the silicon substrate 101. The diffusion layers 106 serve as source and drain regions, respectively. Moreover, a gate oxide film 103 is deposited between the diffusion layers 106 and on the silicon substrate 101. A gate electrode 104 is formed on the gate oxide film 103. Further, spacer oxide films 105 are placed at side surfaces of the gate electrode 104.

In this event, metal silicide layers 108 each of which has a high melting point are formed on the surfaces of the diffusion layers 106 and on the gate electrode 104, respectively. Recently, the above metal silicide layer 108 has become essential to miniaturize the semiconductor device.

Further, a silicon oxide film 109 is deposited on the silicon substrate 101 so as to cover the silicon oxide films 102, the diffusion layers 106 and the gate electrode 103. Herein, it is to be noted that the silicon oxide film 109 generally serves as an interlayer insulating film.

With such a structure, metal plugs 110 are formed in the silicon oxide film 109 so as to reach the silicide layers 108. Further, wiring patterns 111 are formed at upper surfaces of the metal plugs 110. Under this condition, the silicide layers 108 are electrically connected to the wiring patterns 111 via the metal plugs 110. Finally, the entire surface of the silicon device is covered with the silicon nitride film 112 (thereinafter, may be called a SiN film). Herein, the silicon nitride film generally serves as a passivation film.

When the silicon nitride film (SiN film) 112 is deposited by the use of the plasma CVD method, the resultant SiN film 112 often has a relatively small water-permeability. In this event, an active hydrogen radicals take place when the SiN film 112 is formed in a plasma atmosphere containing ammonia and silane. In this event, the hydrogen radicals diffuse into the gate oxide film 103. Consequently, the Si—H combinations are increased in the gate oxide film 103 so as to cause hot carrier deterioration.

Thus, problems with respect to the hot carrier deterioration can not be solved by the first conventional reference.

Alternatively, when the interlayer insulating film, such as the silicon oxide film 109 illustrated in FIG. 1, is replaced by a SOG (namely, spin on glass) film, the interlayer insulating film generally contains slight water. However, the SiN film 112 does not almost pass through the water, as mentioned before. Consequently, the water in the interlayer insulating film mostly diffuses in the direction of the gate oxide film 103 during a final heat treatment in foaming gas, as illustrated in FIG. 3.

Figure 3:
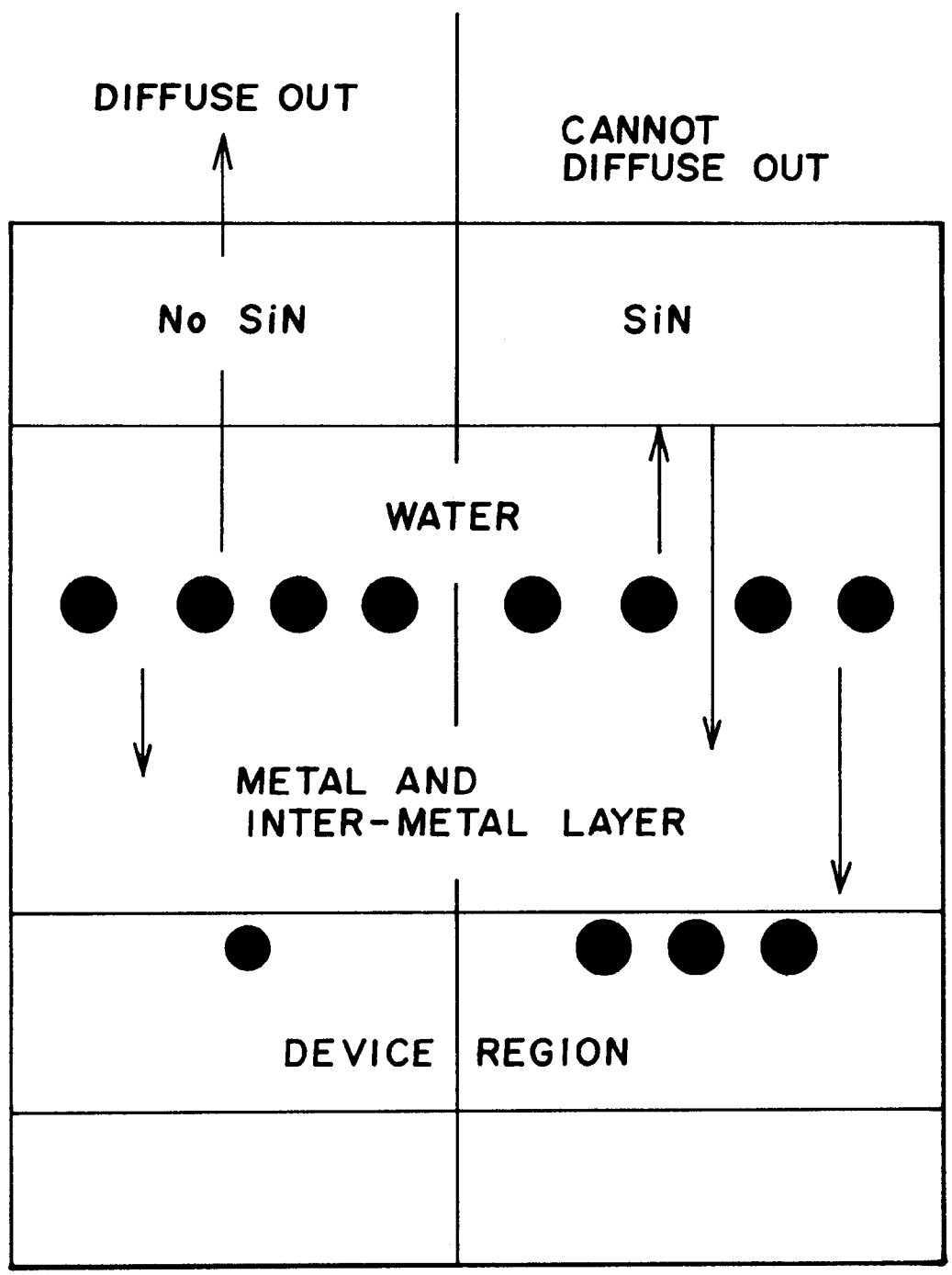
FIG. 3 is a model chart showing phenomenon with respect to a hot carrier deterioration.

More specifically, when the SiN film 112 is placed over the silicon substrate 101, the water (indicated by black circle) diffuses in a direction of a device region and does not diffuse in a direction of the SiN layer 112, as illustrated at the right-hand side in FIG. 3. In contrast, when no SiN layer 112 is placed over the silicon substrate 101, the water (indicated by black circle) does not almost diffuse in the direction of the device region, and mostly diffuse out in the direction the SiN layer 112, as illustrated at the left-hand side in FIG.3.

Thus, when the water diffuses toward the gate oxide film 103 and the spacer oxide film 105, an electron trap (namely, water related trap) which is caused by the water is formed in the gate oxide film 103 and the spacer oxide films 105. As a result, the hot carrier-resist is largely reduced.

Another description will be made about a semiconductor device with respect to the second conventional reference to avoid the above-mentioned problem, referring to FIG. 2. Herein, the second conventional reference is similar to the first conventional reference except that the silicon nitride film (SiN film) 112 is formed below the silicon oxide film 109.

More specifically, as illustrated in FIG.2, silicon oxide films 102 for device separation are formed on a silicon substrate 101 in the second conventional reference. Further, diffusion layers 106 are formed between the silicon oxide films 102 and in the silicon substrate 101. The diffusion layers 106 serve as source and drain regions, respectively. Moreover, a gate oxide film 103 is deposited between the diffusion layers 106 and on the silicon substrate 101. A gate electrode 104 is placed on the gate oxide film 103. Further, spacer oxide films 105 are placed at side surfaces of the gate electrode 104.

In this event, metal silicide layers 108 each of which has a high melting point are formed on the surfaces of the diffusion layers 106 and on the gate electrode 104, respectively.

Further, a silicon nitride film (a SiN film) 112 is deposited on the silicon substrate 101 so as to cover the silicon oxide films 102, the diffusion layers 106 and the gate electrode 103. Moreover, a silicon oxide film 109 is deposited on the silicon nitride film 112.

With such a structure, metal plugs 110 are formed in the silicon oxide film 109 and the silicon nitride film 112 so as to reach the silicide layers 108. Further, wiring patterns 111 are formed on the surfaces of the metal plugs 110. Under this condition, the silicide layers 108 are electrically connected to the wiring patterns 111 via the metal plugs 110.

In this case, when the silicon nitride film 112 is formed by the use of the thermal decomposition CVD method, the diffusion of the water is suppressed because the generation of the active hydrogen radicals is prevented during the formation of the silicon nitride film (SiN film) 112.

However, the thermal process temperature which is necessary for the thermal decomposition containing ammonia and silane is higher than the deposition temperature of the plasma method. Consequently, the heat resistance of the silicide layer 108 becomes a problem. Namely, the short channel effect must be suppressed by preventing the diffusion of the impurities doped into the diffusion layers 106 to achieve the high integration in the MOSFET.

When the connection surface of the diffusion layer 106 contacts with the silicide oxide film 108, a leak current which is caused by crystal defects is increased, and as a result, the switching operation of the transistor often becomes impossible. Therefore, the above silicide layer 108 must be thinned in accordance with the shallow connection of the diffusion layer 106.

However, when the deposition temperature of the silicon nitride film 112 exceeds the heat resistance of the silicide oxide film 108 in the case of the thinned silicide layer 108, the silicide layer 108 is aggregated to form a discontinuous film. As a result, disconnection takes place, and the sheet resistance is increased.

Taking the above-mentioned problems into consideration, this invention provides a semiconductor device which is highly integrated and which is capable of effectively reducing a hot carrier deterioration while keeping a low resistance even when thin-film silicide layers are placed on the surfaces of diffusion layers and the gate electrode.

(First embodiment)

Figure 4:
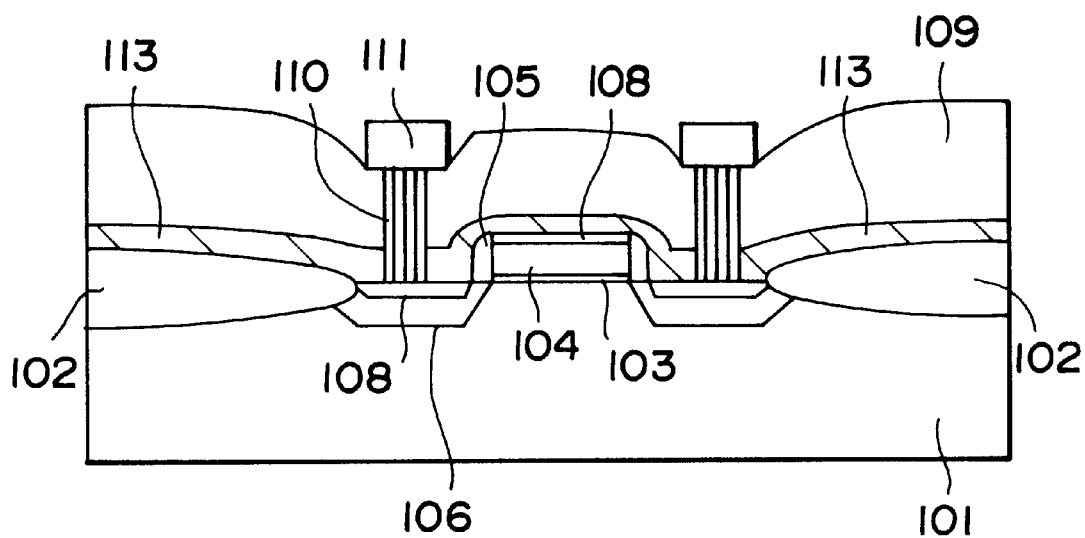
FIG. 4 is a cross sectional view showing a semiconductor device according to a first embodiment of this invention.

Referring to FIG. 4, description will be made about a semiconductor device according to a first embodiment of this invention.

As illustrated in FIG. 4, silicon oxide films 102 for device separation are formed on a silicon substrate 101. Further, diffusion layers or regions 106 are formed between the silicon oxide films 102 and in the silicon substrate 110. The diffusion layers 106 serve as source and drain regions, respectively. Moreover, a gate oxide film 103 is deposited between the diffusion layers 106 and on the silicon substrate 101. A gate electrode 104 is placed on the gate oxide film 103. Further, spacer oxide films 105 are formed at side surfaces of the gate electrode 104.

In this event, metal silicide layers 108 each of which has a high melting point are formed on the surfaces of the diffusion layers 106 and on the gate electrode 104, respectively. Recently, the above metal silicide layer 108 often becomes essential to miniaturize the semiconductor device, as mentioned before.

Further, a diamond-like carbon film 113 is deposited on the silicon substrate 101 so as to cover the silicon oxide films 102, the diffusion layers 106 and the gate electrode 103. Herein, the diamond-like carbon film 113 serves to prevent water from diffusing into the gate oxide film 103. Moreover, a silicon oxide film 109 is deposited on the diamond-like carbon film 13. In this event, the diamond-like carbon film 113 and silicon oxide film 109 serves as interlayer insulating films, respectively.

With such a structure, metal plugs 110 are formed in the silicon oxide film 109 and the diamond-like carbon film 113 so as to reach the silicide layers 108. Further, wiring patterns 111 are formed on the upper surfaces of the metal plugs 110. Under this condition, the silicide layers 108 are electrically connected to the wiring patterns 111 via the metal plugs 110.

Subsequently, description will be made about a method of manufacturing the semiconductor device illustrated in FIG. 4, referring to FIGS. 5A through 5C and FIGS. 6A and 6B.

Figure 5A:
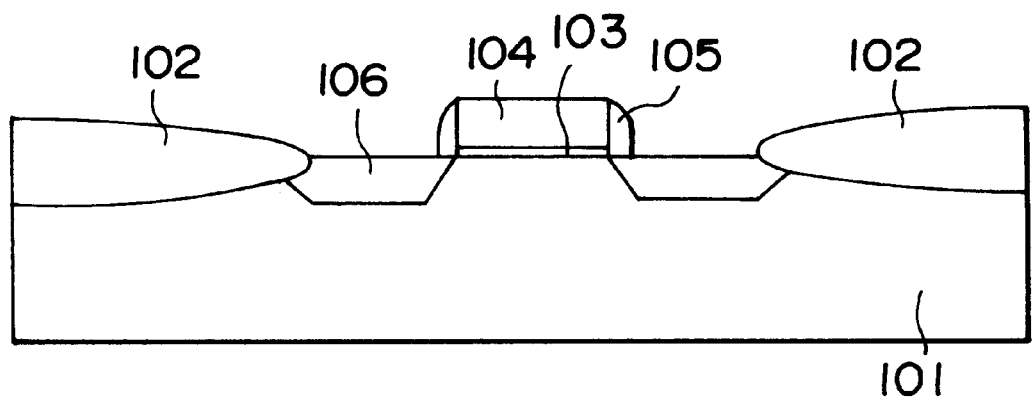
FIGS. 5A through 5C are cross sectional views showing steps of manufacturing the semiconductor device according to the first embodiment.

As shown in FIG. 5A, the silicon oxide films 102 for the device separation are formed at preselected regions on the silicon substrate 101 by the use of the known LOCCOS method. Subsequently, impurity ions are doped to form a channel stopper (not shown). Thereafter, the gate oxide film 103 is deposited by the use of the thermal oxidation method.

Next, a polysilicon film having the film thickness of about 150 nm is deposited on the entire surface by the use of the CVD (Chemical Vapor Deposition) method. Successively, impurities, such as phosphorus, is doped into the polysilicon. Subsequently, the polysilicon is patterned to a preselected shape by the use of the lithography and the dry-etching process to form the gate electrode 104. Next, the silicon oxide film is deposited on the entire surface by the use of the CVD method. Successively, the silicon oxide films are left at the both side surfaces of the gate electrode 104 by the use of the anisotropic dry-etching process to form the spacer oxide films 105.

Subsequently, after impurities, such as arsenic and boron, are doped into the silicon substrate 101, a heat treatment is carried out at a temperature between 800° C. and 1000° C. to form the diffusion layers 106, as illustrated in FIG. 5A. Herein, it is to be noted that each of the diffusion layers 106 contains the arsenic when the MOSFET is of an N-channel type while each of the diffusion layers 106 contains the boron when the MOSFET is of a P-channel type. In this event, the diffusion layers serve as source and drain regions of the transistor.

Figure 5B:
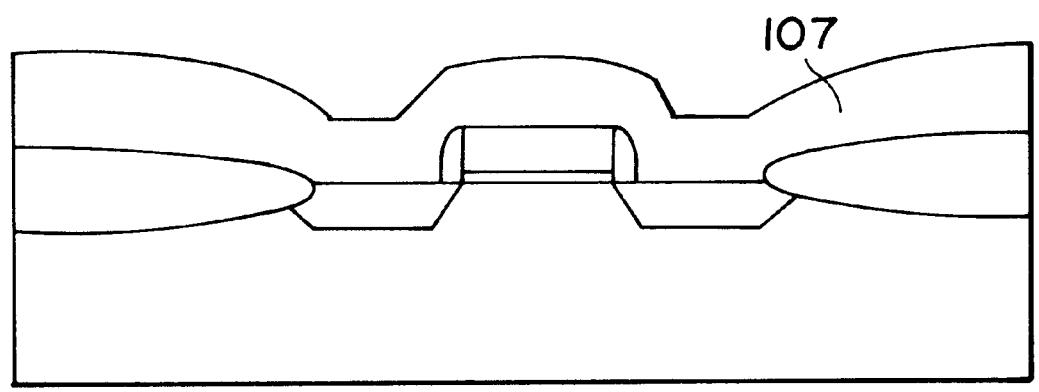

Thereafter, a titanium film 107 is deposited to the thickness of about 50 nm on the entire surface by the use of the sputtering method using metal, as shown in FIG. 5B. Successively, the heat treatment is carried out at a temperature between 600° C. and 650° C. and for about 30 to 60 seconds in a nitrogen atmosphere having a normal pressure. In this event, a lamp anneal apparatus is normally used for the above heat treatment. The titanium film becomes the silicide layers on the exposed surface of the gate electrode 104 and the surface of the diffusion layers 106 by the above heat treatment. Consequently, the silicide layer of a C49 structure which has an excellent crystal structure of an electrical resistivity of about 60 $\mu\Omega$·cm is formed while the titanium film of the outer surface side is changed into a titanium nitride.

Subsequently, the substrate 101 is processed in a mixed liquid containing ammonia solution, pure water and excess oxidation hydrogen water to remove the titanium nitride layer. Thus, the silicide layers 108 of the C49 structure are formed on the surfaces of the gate electrode 104 and the diffusion layers 106 in the self-alignment manner.

Figure 5C:
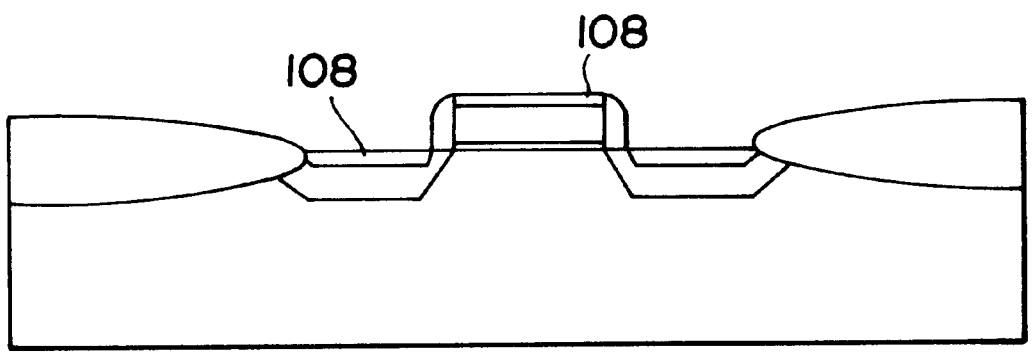

Furthermore, a second heat treatment is performed at a temperature of about 85° C. for about 60 seconds in the nitrogen atmosphere of the normal pressure by the use of the above-mentioned lamp anneal apparatus. By this process, the above-mentioned silicide layer of the C49 structure is changed into the silicide layer 108 of a C54 structure which has a crystal structure of a low electrical resistivity of about 20 $\mu\Omega$·cm. Thus, the structure illustrated in FIG. 5C is completed.

Figure 6A:
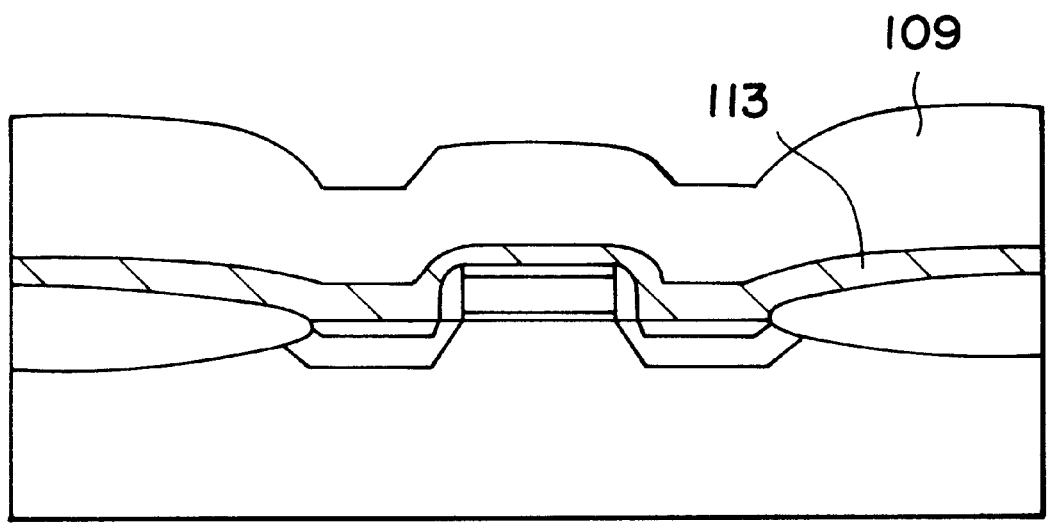
FIGS. 6A and 6B are cross sectional views showing the remaining steps of manufacturing the semiconductor device according to the first embodiment.

Successively, fluorine in a source gas is decomposed by applying a bias of about 50 W into the substrate 101 at a substrate temperature of about 100° C. using $C_4F_8$ gas by the use of the plasma CVD to deposit the diamond-like carbon layer 113 which does not pass through the water, as illustrated in FIG. 6A. In this event, the deposition rate is equal to about 200 nm/min. Herein, fluoro carbon based gas may be used as the above source gas instead of the $C_4F_8$ gas. Alternatively, the source gas may be diluted by the use of methane gas and like.

Subsequently, the silicon oxide film 109 is deposited to the film thickness of 1 $\mu$m, as illustrated in FIG. 6A. Next, contact holes are formed in the silicon oxide film 109 and the diamond-like carbon layer 113 by the dry-etching method so as to reach the silicide layers 108 on the surface of the diffusion layers 106.

Figure 6B:
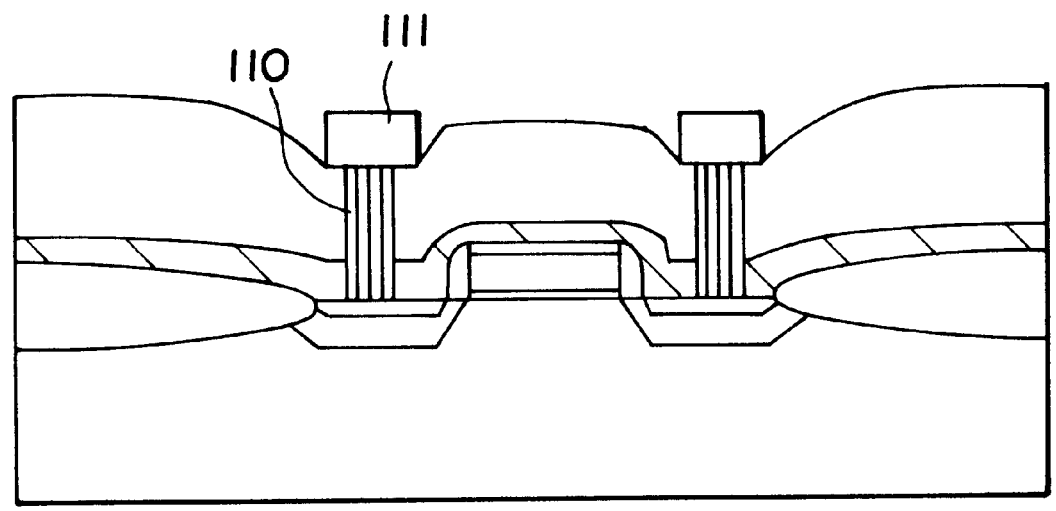

Successively, the metal plugs 110 are formed in the above contact holes by the use of the vapor deposition method or the sputtering method, as shown in FIG. 6B. Next, the wiring layer 111 are formed by the use of the known resist-patterning process and the known etching process.

Thus, the semiconductor device according to this invention is completed, as illustrated in FIG. 6B.

Figure 8:
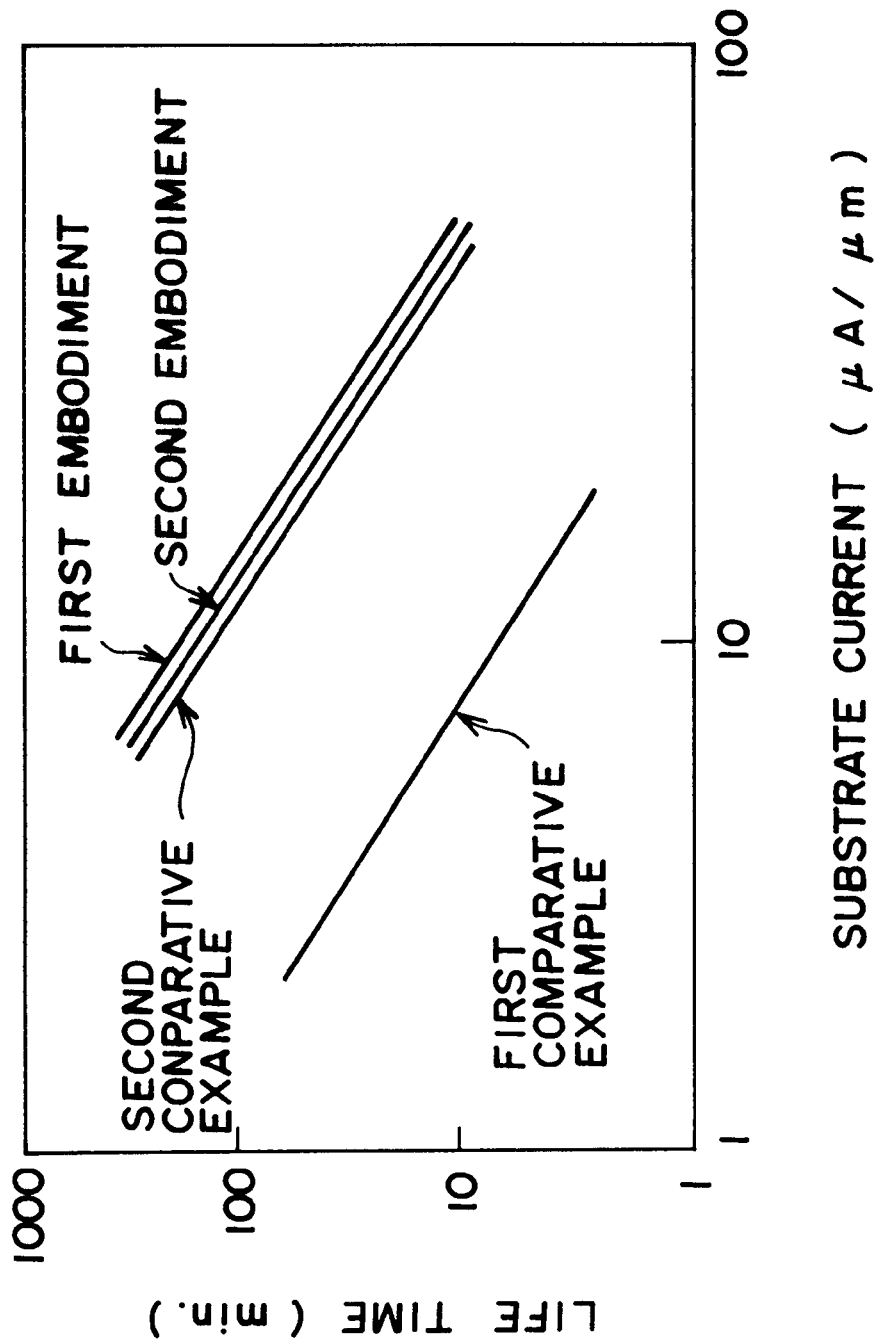
FIG. 8 is a graph showing a measuring result of a hot carrier life time.

In this case, the hot carrier life time of the MOSFET having the above structure was measured. The result of the measurement is represented in FIG. 8. In this event, the hot carrier life time is longest among the other embodiment and comparative examples, as shown in FIG. 8.

Further, the resistance of the silicide layer 108 was measured with respect to silicide line width between 0.1 $\mu$m and 0.4 $\mu$m. The result of the measurement is represented in FIG. 9. As shown in FIG. 9, the silicide layer resistance of the first embodiment is remarkably lower than that of the second comparative example at the silicide line width less than 0.2 $\mu$m.

(Second embodiment)

Figure 7:
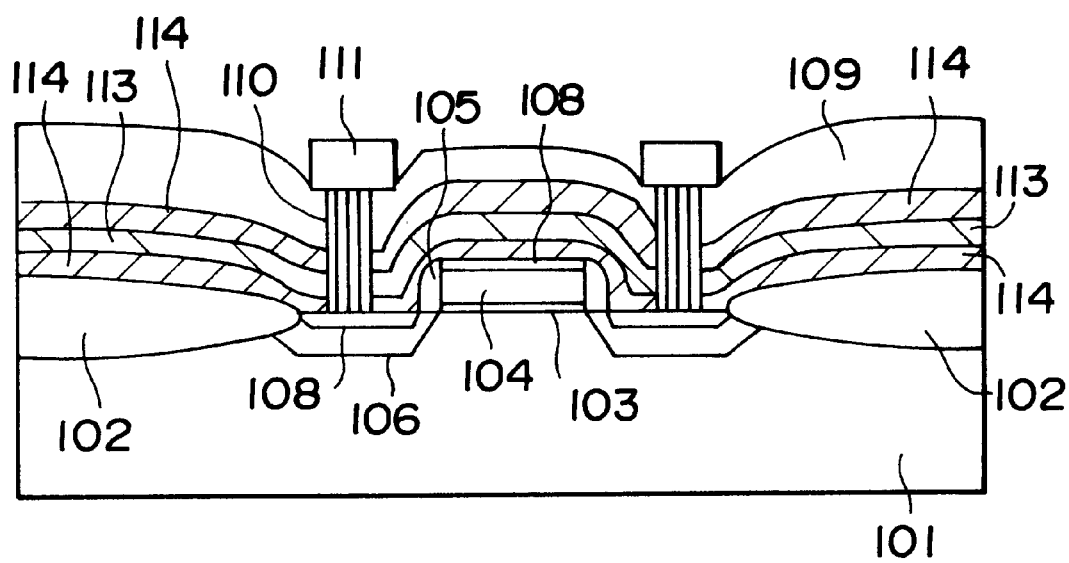
FIG. 7 is a cross sectional view showing a semiconductor device according to a second embodiment of this invention.

In the first embodiment, the diamond-like carbon layer 113 is formed directly on the silicide layers 108, the diffusion layers 106, the gate electrode 104 and the silicon oxide films 102. In contrast, the diamond-like carbon film 113 is interposed between silicon oxide films 114 each of which excessively contains the silicon in the second embodiment, as illustrated in FIG. 7. Herein, the silicon oxide film 114 which excessively contains the silicon will be thereinafter called a silicon excess silicon oxide film. The MOSFET according to the second embodiment is similar to that of the first embodiment except this point.

Subsequently, description will be made about a method of manufacturing the MOSFET according to the second embodiment.

First, the silicide layers 108 are formed by using the steps illustrated in FIGS. 5A through 5C, like the first embodiment.

Next, the silicon excess silicon oxide film 114 is deposited over the silicon substrate 101 so as to cover the silicon oxide films 102, the diffusion layer 106, the gate electrode 108 and the spacer oxide films 105. Herein, the flow rate of the silane is more excessive than that of the oxygen. In this event, the silicon excess silicon oxide film 114 has a film composition which contains more silicon as compared to the rate of 1:2 between the silicon and the oxygen.

Subsequently, the diamond-like carbon film 113 is formed, like in the first embodiment. Thereafter, another silicon excess silicon oxide film 114 is deposited on the diamond-like carbon film 113. Herein, the silicon excess silicon oxide film 114 also has the film composition which contains more silicon as compared to the rate of 1:2 between the silicon and the oxygen.

Successively, the silicon oxide film 109 is formed on the silicon excess silicon oxide film 114. Thus, the MOSFET illustrated in FIG. 7 is completed in the second embodiment.

According to the second embodiment, the diamond-like carbon film 113 is sandwiched between the silicon excess oxide films 14, as illustrated in FIG. 7. Consequently, the adhesion with the silicon oxide film 109 is largely improved. Namely, it is assumed that the adhesion is enhanced by the SiC combination which is formed between the diamond-like carbon layer 113 and the silicon oxide film ($SiO_2$). By improving the adhesion, the interlayer insulating film can endure for the stress which is caused from the silicon oxide film 109 of the upper layer.

In this case, the hot carrier life time and the silicide layer resistance were measured, respectively. The results of the measurement are represented in FIGS. 8 and 9, respectively. Although the hot carrier life time of the second embodiment is shorter than that of the first embodiment, it is longer than the subsequent comparative examples, as shown in FIG. 8. Further, the silicide layer resistance is lower than the subsequent comparative example at the silicide line with of less than 0.2 $\mu$m, as illustrated in FIG. 9

FIRST COMPARATIVE EXAMPLE

A first comparative example corresponds to the first conventional reference in FIG. 1.

As illustrated in FIG. 1, the semiconductor device is formed without the diamond-like carbon film 113. In the first comparative example, after the metal plugs 110 and the wiring layer 111 are formed, the silicon nitride film (SiN film) is deposited on the surface. In this event, the hot carrier life time was measured in the first comparative example. The result of the measurement is represented in FIG. 8. The hot carrier life time of the first comparative example is shortest among the first and second embodiment and the first and second comparative examples, as shown in FIG. 8.

SECOND COMPARATIVE EXAMPLE

A second comparative example corresponds to the second conventional reference in FIG. 2.

As shown in FIG. 2, the silicon nitride film 112 is deposited to the film thickness of about 50 nm instead of the diamond-like carbon layer 113 illustrated in FIG. 4. In this event, the silicon nitride film 112 is formed by the use of the thermal CVD method in which the reaction is carried out in the thermal atmosphere of about 700° C. using the silane gas and the ammonia gas. The silicide layers 108, the diffusion layers 106, the gate electrode 104 and the silicon oxide films 102 are covered with the silicon nitride film 112 in the second comparative example, as shown in FIG. 2. The second comparative example is similar to the first embodiment except for this point. In this case, the hot carrier life time and the silicide layer resistance were measured in the second comparative example.

The results of the measurements are represented in FIGS. 8 and 9, respectively. The hot carrier life time of the second comparative example is shorter than the first and second embodiment, as shown in FIG. 8.

Further, the silicide resistance is remarkably increased when the silicide line width becomes relatively small (in particular, less than about 0.2 μm) in the second comparative example, as illustrated in FIG. 9.

What is claimed is:

1. A semiconductor device having a silicon substrate, comprising:
    first silicon oxide films on said silicon substrate to electrically separate said device from another device;
    a pair of diffusion regions in said substrate between said first silicon oxide films and which serves as source and drain regions;
    a gate oxide film formed between said diffusion regions and on said silicon substrate;
    a gate electrode placed on said gate oxide film;
    silicide layers formed on said gate electrode and in surface regions of said diffusion regions;
    a second silicon oxide film covering said first silicon oxide film, said diffusion regions, said gate oxide film, said gate electrode and said silicide layers;
    a diamond-like carbon layer formed on said second silicon oxide film and forming a water impermeable barrier over said gate oxide film;
    a third silicon oxide film formed on said diamond-like carbon layer; and
    a fourth silicon oxide film formed on said third silicon oxide film,
    wherein said second silicon oxide film, said diamond-like carbon layer, said third silicon oxide film and said fourth silicon oxide film are sequentially laminated in this order over said silicon substrate so as to serve as interlayer insulative layers.

2. A device as claimed in claim 1, wherein said third silicon oxide film contains water, and
    wherein said diamond-like carbon layer prevents said water in said third silicon oxide film from diffusing into said gate oxide film.

3. A device as claimed in claim 1, further comprising spacer oxide films which are placed at both surfaces of said gate electrodes, wherein said second silicon oxide film covers said spacer films.

4. A semiconductor device having a silicon substrate, comprising:
    first silicon oxide films on said silicon substrate to electrically separate said device from another device,
    a pair of diffusion regions placed in said silicon substrate and between said first silicon oxide films and which serve as source and drain regions;
    a gate oxide film formed between said diffusion regions and on said silicon substrate;
    a gate electrode placed on said gate oxide film;
    silicide layers formed on said gate electrode and in surface regions of said diffusion regions;
    a second silicon oxide film that excessively contains silicon so as to cover said first silicon oxide film, said diffusion regions, said gate oxide film, said gate electrode and said silicide layers;
    a diamond-like carbon layer formed on said second silicon oxide film and forming a water impermeable barrier over said gate oxide film;
    a third silicon oxide film that excessively contains silicon and which is formed on said diamond-like carbon layer; and
    a fourth silicon oxide film formed on said third silicon oxide film.

5. A device as claimed in claim 4, wherein:
    said fourth silicon oxide film contains the water,
    said diamond-like carbon layer preventing the water in the fourth silicon oxide film from diffusing into said gate oxide film.

6. A device as claimed in claim 4, further comprising:
    spacer oxide films placed at both side surfaces of said gate electrode.

7. A semiconductor device having an interlayer insulating film over a silicon substrate comprising a gate layer and a gate oxide film, wherein said interlayer insulating film comprises:
    a diamond-like carbon layer forming a water impermeable barrier over said gate oxide film;
    a first silicon oxide film provided on one side of said diamond-like carbon layer;
    a second silicon oxide film formed on another side of said diamond-like carbon layer;
    a third silicon oxide film formed on said second silicon oxide film;
    wherein the semiconductor device further comprises;
        a first wiring layer provided under said first silicon oxide film; and a second wiring layer provided on said third silicon oxide film and electrically connected to said first wiring layer;
        said diamond-like carbon layer being placed between said first wiring layer and said second wiring layer.

8. A semiconductor device having a silicon substrate, comprising:
    first silicon oxide films on said silicon substrate to electically separate said device film another device;
    a pair of diffusion regions in said silicon substrate between said first silicon oxide films and which serve as source and drain regions;
    a gate oxide film formed between said diffusion regions and on said silicon substrate;
    a gate electrode placed on said gate oxide film;
    a second silicon oxide film containing excessive silicon and covering said first silicon oxide film, said diffusion regions, said gate oxide film and said gate electrode;
    a diamond like carbon layer formed on said second silicon oxide film and forming a water impermeable barrier over said gate oxide film;
    a third silicon oxide film formed on said diamond-like carbon layer; and
    a fourth silicon oxide film formed on said third silicon oxide film.

9. A semiconductor device having a silicon substrate, comprising:
    first silicon oxide films on said silicon substrate to electrically separate said device from another device;
    a pair of diffusion regions in said silicon substrate between said first silicon oxide films and which serve as source and drain regions;

a gate oxide film formed between said diffusion regions and on said silicon substrate;

a gate electrode placed on said gate oxide film;

a second silicon oxide film covering said first silicon oxide film, said diffusion regions, said gate oxide film and said gate electrode;

a diamond-like carbon layer formed on said second silicon oxide film and forming a water impermeable barrier over said gate oxide film;

a third silicon oxide film containing excessive silicon and formed on said diamond-like carbon layer; and a fourth silicon oxide film formed on said third silicon oxide film.

10. A semiconductor device having a substantially dry gate oxide film comprising:

a silicon substrate;

first silicon oxide films on said silicon substrate to electrically separate said device from another device;

a pair of diffusion regions in said silicon substrate between said first silicon oxide films to serve as source and drain regions;

a gate oxide film formed between said diffusion regions and on said silicon substrate;

a gate electrode on said gate oxide film;

an interlayer insulating layer comprising:

a diamond-like carbon layer on said first silicon oxide films, said gate electrode and said diffusion regions and forming a water impermeable barrier over said gate oxide film; and a second silicon oxide film formed on said diamond-like carbon layer.

11. The semiconductor device according to claim 10, further comprising:

silicide layers formed on said gate electrode and in surface regions of said diffusion regions, wherein said diamond like carbon layer covers said silicide layers.

12. The semiconductor device according to claim 10, further comprising:

spacer oxide films formed on side surfaces of said gate electrodes, wherein said diamond like carbon layer covers said spacer films .

13. The semiconductor device according to claim 10, wherein said diamond like carbon layer comprises fluorine.

14. The semiconductor device according to claim 10, wherein said diamond like carbon layer prevents water in said second silicon oxide film from diffusing to said gate oxide film.

15. The semiconductor device according to claim 10, wherein a thickness of said gate oxide film is no greater than 10 nm.

16. The semiconductor device according to claim 10, wherein a surface of said gate oxide film is devoid of Si—H combinations.

17. The semiconidutor device according to claim 13, wherein a concentration of said fluorine is uniform throughout a thickness of said diamond like carbon layer.

18. The semiconductor device according to claim 10, wherein said interlayer insulating layer is devoid of silicon nitride.

19. The semiconductor device according to claim 7, wherein said first wiring layer comprises a silicide layer.

* * * * *